United States Patent
Gronet et al.

[11] Patent Number: 5,840,125
[45] Date of Patent: Nov. 24, 1998

[54] RAPID THERMAL HEATING APPARATUS INCLUDING A SUBSTRATE SUPPORT AND AN EXTERNAL DRIVE TO ROTATE THE SAME

[75] Inventors: Christian M. Gronet; James F. Gibbons, both of Palo Alto, Calif.

[73] Assignee: Applied Materials, Inc., Santa Clara, Calif.

[21] Appl. No.: 508,601

[22] Filed: Jul. 28, 1995

Related U.S. Application Data

[62] Division of Ser. No. 131,830, Oct. 5, 1993, Pat. No. 5,487,127, which is a division of Ser. No. 882,656, May 13, 1992, Pat. No. 5,317,492, which is a division of Ser. No. 781,632, Oct. 24, 1991, Pat. No. 5,155,336, which is a continuation of Ser. No. 467,808, Jan. 19, 1990, abandoned.

[51] Int. Cl.⁶ .................................................. C23C 16/00
[52] U.S. Cl. ........................... 118/730; 118/728; 118/500; 118/50; 118/50.1
[58] Field of Search .................................. 118/728, 730, 118/50, 50.1, 500

[56] References Cited

U.S. PATENT DOCUMENTS

| | | | |
|---|---|---|---|
| 2,057,776 | 10/1936 | Groven | 219/552 |
| 2,318,533 | 5/1943 | Selvig | 219/155 |
| 3,226,254 | 12/1965 | Reuschel | 117/201 |
| 3,623,712 | 11/1971 | McNeilly et al. | 263/41 |
| 3,645,230 | 2/1972 | Hugle et al. | 118/49.5 |
| 3,761,678 | 9/1973 | Eckles | 219/343 |
| 3,836,751 | 9/1974 | Anderson | 219/411 |
| 3,862,397 | 1/1975 | Anderson et al. | 219/405 |
| 3,936,686 | 2/1976 | Moore | 313/36 |
| 4,047,496 | 9/1977 | McNeilly et al. | 118/49.1 |
| 4,081,313 | 3/1978 | McNeilly et al. | 156/610 |
| 4,101,759 | 7/1978 | Anthony et al. | 219/343 |
| 4,206,719 | 6/1980 | Faris | 119/5 |
| 4,232,360 | 11/1980 | Vakil et al. | 362/218 |
| 4,270,260 | 6/1981 | Krueger | 29/403.4 |
| 4,378,956 | 4/1983 | Lester | 359/42 |
| 4,389,970 | 6/1983 | Edgerton | 118/666 |
| 4,411,619 | 10/1983 | Darnell et al. | 219/405 |
| 4,448,000 | 5/1984 | Manuccia et al. | 52/208 |
| 4,470,369 | 9/1984 | Edgerton | 118/723 |
| 4,489,234 | 12/1984 | Harnden, Jr. et al. | 219/461 |
| 4,510,555 | 4/1985 | Mori | 362/32 |
| 4,558,660 | 12/1985 | Nishizawa et al. | 118/725 |
| 4,640,224 | 2/1987 | Bunch et al. | 118/725 |
| 4,649,261 | 3/1987 | Sheets | 219/390 |
| 4,680,447 | 7/1987 | Mahawili | 219/343 |
| 4,680,451 | 7/1987 | Gat et al. | 219/411 |
| 4,694,143 | 9/1987 | Nishimura et al. | 219/388 |
| 4,698,486 | 10/1987 | Sheets | 250/492.2 |
| 4,761,538 | 8/1988 | Chiba et al. | 219/497 |
| 4,789,771 | 12/1988 | Robinson | 219/411 |
| 4,796,562 | 1/1989 | Brors et al. | 118/725 |

(List continued on next page.)

FOREIGN PATENT DOCUMENTS

| | | | |
|---|---|---|---|
| 308388 | 3/1989 | European Pat. Off. | H05B 3/00 |
| 60-253939 | 12/1985 | Japan | G01J 5/02 |
| 1-93113 | 4/1989 | Japan | 118/730 |

OTHER PUBLICATIONS

"Measurement of Dynamic Temperature Uniformity in Rapid Thermal Processing", Solid State Technology, May, 1988.

"Critical Radial Temperature Gradient Inducing Slip Dislocations in Silicon Epitaxy Using Dual Heating of the Two Surfaces of a Wafer", vol. 25, No. 11, Nov. 1986 pp. 1619–1622.

*Primary Examiner*—R. Bruce Breneman
*Assistant Examiner*—Jeffrie R Lund
*Attorney, Agent, or Firm*—Fish & Richardson, P.C.

[57] ABSTRACT

A rapid thermal heating apparatus including a substrate support and a bearing assembly in a processing chamber. The substrate support is mounted on the bearing assembly so that it may be rotated. A rotatable drive ring is located external to the processing chamber. The drive ring provides a force to couple the bearing assembly to the drive ring without the use of a vacuum seal so that rotation of the drive ring causes the substrate support to rotate.

2 Claims, 7 Drawing Sheets

U.S. PATENT DOCUMENTS

| | | | |
|---|---|---|---|
| 4,818,327 | 4/1989 | Davis et al. | 156/345 |
| 4,820,377 | 4/1989 | Davis et al. | 156/643 |
| 4,830,700 | 5/1989 | Davis et al. | 156/345 |
| 4,832,777 | 5/1989 | Davis et al. | 156/345 |
| 4,832,779 | 5/1989 | Fisher et al. | 156/345 |
| 4,836,138 | 6/1989 | Robinson et al. | 118/666 |
| 4,854,263 | 8/1989 | Chang | 118/715 |
| 4,859,832 | 8/1989 | Uehara et al. | 219/411 |
| 4,879,886 | 11/1989 | Okada | 66/151 |
| 4,886,954 | 12/1989 | Yu et al. | 219/390 |
| 4,891,499 | 1/1990 | Moslehi | 219/502 |
| 4,911,103 | 3/1990 | Davis et al. | 118/725 |
| 4,924,073 | 5/1990 | Chiba | 219/413 |
| 4,956,538 | 9/1990 | Moslehi | 219/121.6 |
| 5,113,102 | 5/1992 | Gilmore | 118/50.1 |
| 5,155,336 | 10/1992 | Gronet | 219/411 |
| 5,156,820 | 10/1992 | Wong et al. | 422/186.05 |
| 5,169,684 | 12/1992 | Takagi | 427/248.1 |
| 5,215,588 | 6/1993 | Rhieu | 118/715 |
| 5,270,600 | 12/1993 | Hashimoto | 310/75 |
| 5,317,492 | 5/1994 | Gronet | 362/294 |
| 5,468,299 | 11/1995 | Tsai | 118/730 |
| 5,487,127 | 1/1996 | Gronet | 392/418 |

RAPID THERMAL HEATING APPARATUS INCLUDING A SUBSTRATE SUPPORT AND AN EXTERNAL DRIVE TO ROTATE THE SAME

This is a continuation of application Ser. No. 08/131,830 filed Oct. 5, 1993, now U.S. Pat. No. 5,487,127 which is a division of Ser. No. 07/882,656 filed May 13, 1992, now U.S. Pat. No. 5,317,492 which is a division of application Serial No. 07/781,632 filed on Oct. 24, 1991, now U.S. Pat. No. 5,155,336, which is a continuation of application Ser. No. 07/467,808 filed Jan. 19, 1990, now abandoned.

This invention relates generally to a rapid thermal heating apparatus and method for heating substrates and more particularly to such an apparatus which includes spatial control of the substrate heating.

BACKGROUND OF THE INVENTION

In the semiconductor industry, it is desirable to obtain temperature uniformity in the substrate during temperature cycling of substrate. Temperature uniformity provides uniform process variables on the substrate (e.g. layer thickness, resistivity, etch depth) for temperature activated steps such as film deposition, oxide growth and etching. In addition, temperature uniformity in the substrate is necessary to prevent, thermal stress-induced wafer damage such as warpage, defect generation and slip.

FIG. 1 schematically shows a prior art flood type rapid thermal heating apparatus in which a wafer 11 disposed in chamber 12 is heated by radiation from a plurality of lamps 13. This type of heating apparatus does not provide adequate spatial control of temperature. The primary difficulty is that different areas on the wafer may have different energy absorption or emissivity characteristics. For example, if a flood heating source (assuming uniform illumination across the wafer) is used to heat a wafer during a rapid thermal processing cycle in which the thermally-isolated wafer may be ramped in temperature on the order of 10°–300° C./sec, the edge will maintain a different temperature than the middle because the edge can accept radiant energy from or emit radiant energy to a wider field of view. FIG. 2 shows the temperature at the center and edges of a wafer as a function of time for a flood type heating source. During the temperature ramp-up portions of the heating cycle the edges will be hotter than the center while during the steady state and ramped-down portions the edges will be cooler than the center. These edge to center temperature differences create radial stresses in a wafer which if large enough, can damage the wafer, and are not tolerable in many processes, especially high temperature processes in which the mechanical strength of the wafer is substantially reduced. For example, at 1150° C. the center to edge temperature difference on a four inch silicon wafer of approximately 5° C. can induce dislocation formation and slip. Some conventional flood heating sources, such as a bank of tungsten-halogen lamps or a single arc lamp, can be modified to compensate for center-to-edge temperature differences of one sign, for example, during the temperature ramp up. Shading or reflectors can be used to provide more light energy to the center of the wafer as compared to the edge, but it is impossible for such a heating source to provide temperature uniformity during all parts of the thermal cycle.

Temperature gradients can also be induced by other sources. For example, a wafer may have non-uniform emissivity because of spatial modifications to surface areas or volumes of the wafer. These modifications could include films which have been patterned by photolithography or locally doped regions such as buried layers for bipolar transistors. In addition, the temperature gradients can be induced by localized gas cooling or heating effects, as well as non-uniform endothermic or exothermic reactions which may occur on the substrate surface during processing.

OBJECTS AND SUMMARY OF THE INVENTION

It is a general object of this invention to provide an improved heat source for rapid thermal processing of semiconductor wafers or substrates.

It is a further object of this invention to provide a heat source which allows spatial control of the heat energy applied to the substrate.

It is another object of this invention to provide a heat source which enables spatial control of the heat applied to a wafer or substrate to maintain temperature uniformity despite localized variations in the ability of the wafer to emit or absorb heat energy.

It is another object of this invention to provide a heat source which includes a plurality of independently controlled heat sources which provide energy to predetermined overlapping areas of a substrate or wafer.

It is a further object of this invention to provide a heat source including a plurality of independently controlled heat sources each providing energy to a predetermined area of a substrate or wafer and sensors for sensing the temperature of said area to permit control of applied energy to maintain a uniform temperature across the wafer.

It is still a further object of this invention to provide a heat source which includes a plurality of light pipes, each of which directs energy from an energy source onto predetermined overlapping areas of a wafer or substrate.

It is a further object of this invention to provide an improved light pipe heat source and a process chamber window assembly.

The foregoing and other objects of this invention are achieved by a heat source which includes a plurality of sources of radiant energy each serving to radiate a predetermined area of the substrate, and means for mounting the sources of radiant energy next to each other so that portions of the radiated areas of adjacent sources overlap and the energy intensity at said portions from the different sources add, and a control means for controlling the intensity of each of said sources of radiant energy whereby to control the intensity of radiation at different areas on said wafer or substrate.

More particularly, the invention includes a plurality of radiant energy sources each associated with a light pipe mounted next to another light pipe with the light pipes serving to direct radiant energy from the associated source towards the substrate to radiate a predetermined area of the substrate with a pattern of relative radiant intensity. The light pipes are spaced so that a portion of the radiated area of adjacent light pipes overlaps so that the intensity of radiation at said portions adds to provide a relative intensity across the wafer which is dependent upon the intensity of a combination of said radiant energy sources.

BRIEF DESCRIPTION OF THE DRAWINGS

The foregoing and other objects of the invention will be more clearly understood from the following description when read in connection with the accompanying drawings, of which.

DESCRIPTION OF THE PREFERRED EMBODIMENT

Figure 1:
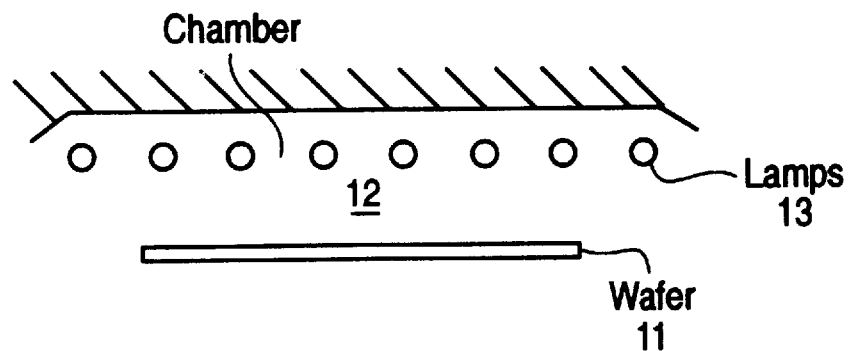
FIG. 1 is a schematic representation of a rapid thermal heating source in accordance with the prior art.
Figure 2:
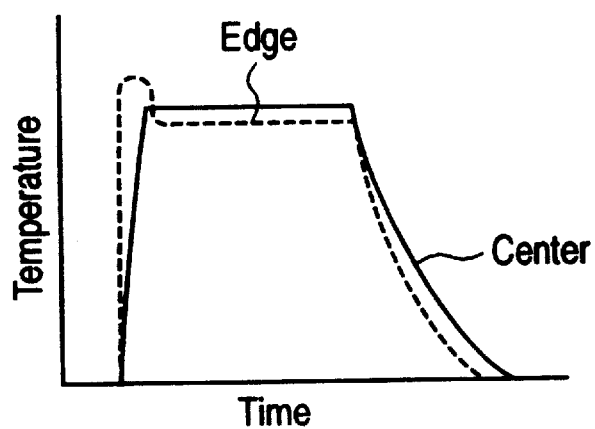
FIG. 2 shows the temperature of a wafer as a function of time at the center and edge when the wafer is radiated with a flood type source.
Figure 3:
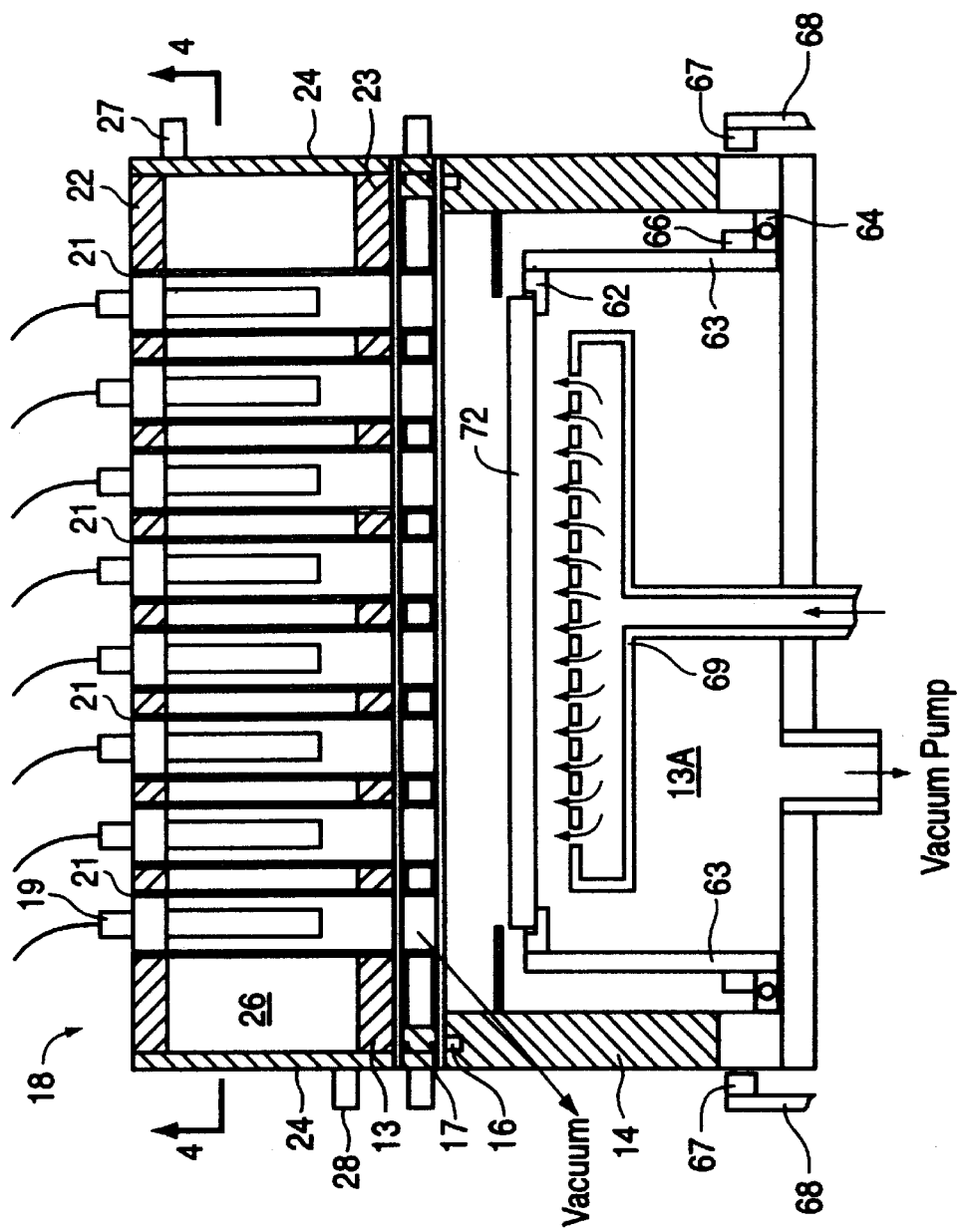
FIG. 3 is a cross sectional view of a rapid thermal heating apparatus in accordance with one embodiment of the present invention taken generally along the line 3—3 of FIG. 4.
Figure 4:
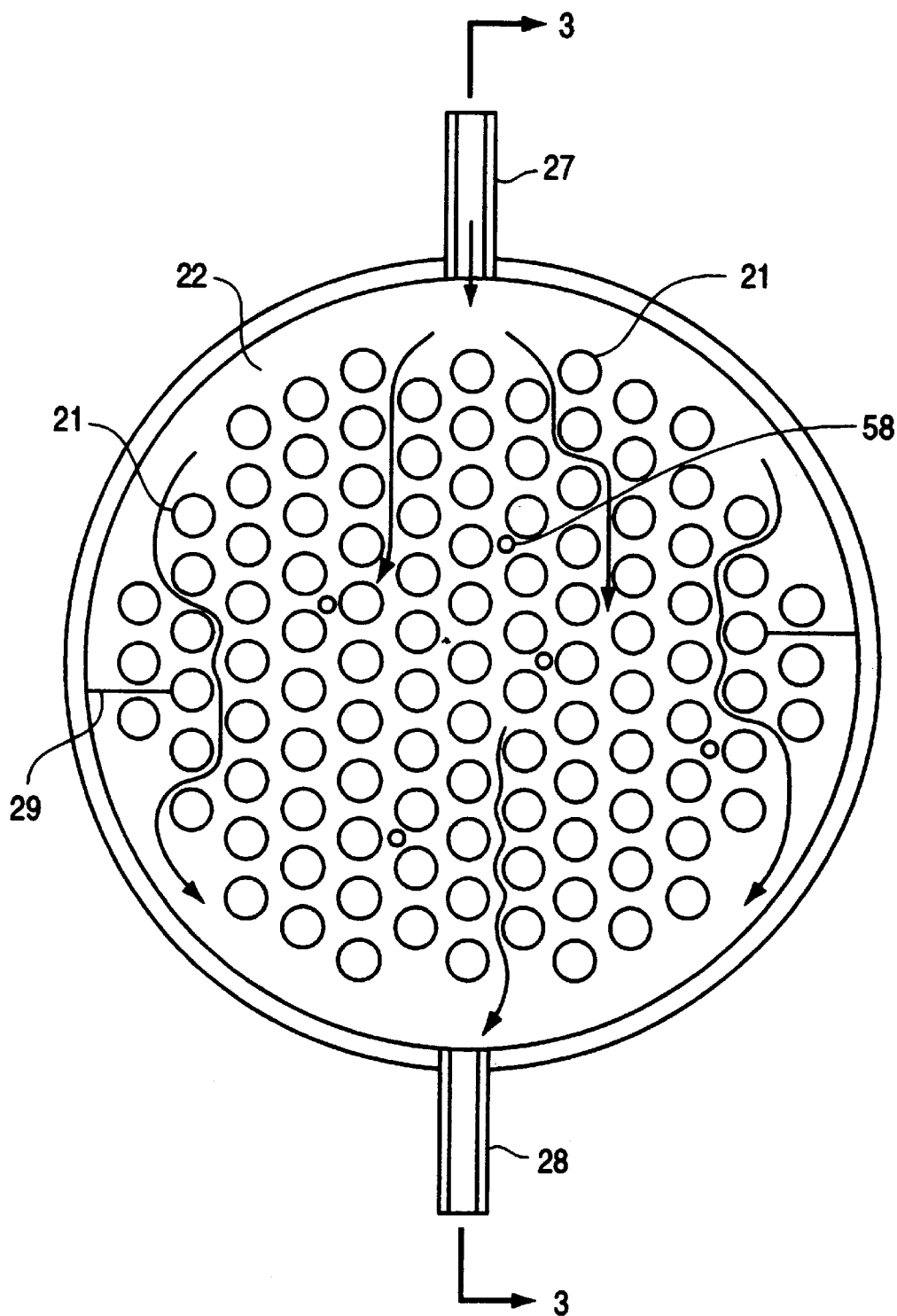
FIG. 4 is a sectional view of a rapid thermal heating apparatus in accordance with the present invention taken along the line 4—4 of FIG. 3.

Referring to FIGS. 3 and 4, the apparatus of this invention is shown associated with an evacuated process chamber 13A. The walls of the chamber are schematically shown at 14. The apparatus forms the upper wall of the chamber and is sealed thereto by O rings 16 which cooperate with the window assembly 17 to be presently described. A radiant energy light pipe assembly 18 is shown overlying the window 17. The radiant energy assembly includes a plurality of tungsten-halogen lamps 19, for example Sylvania EYT lamps, each mounted inside of a light pipe 21 which may be of stainless steel, brass, aluminum or other metal. The ends of the pipes are brazed or welded to openings in upper and lower cooling chamber walls 22 and 23. A cylindrical wall 24 is brazed or welded to the peripheral edge of the walls 22 and 23 and together therewith defines a cooling chamber 26. Coolant, such as water, is introduced into the chamber via the inlet 27 and is removed at the outlet 28. Referring particularly to FIG. 4, the coolant travels in the space between the various light pipes and serves to cool the light pipes. Baffles 29 may be included to ensure proper flow of fluid through the chamber.

Figure 5:
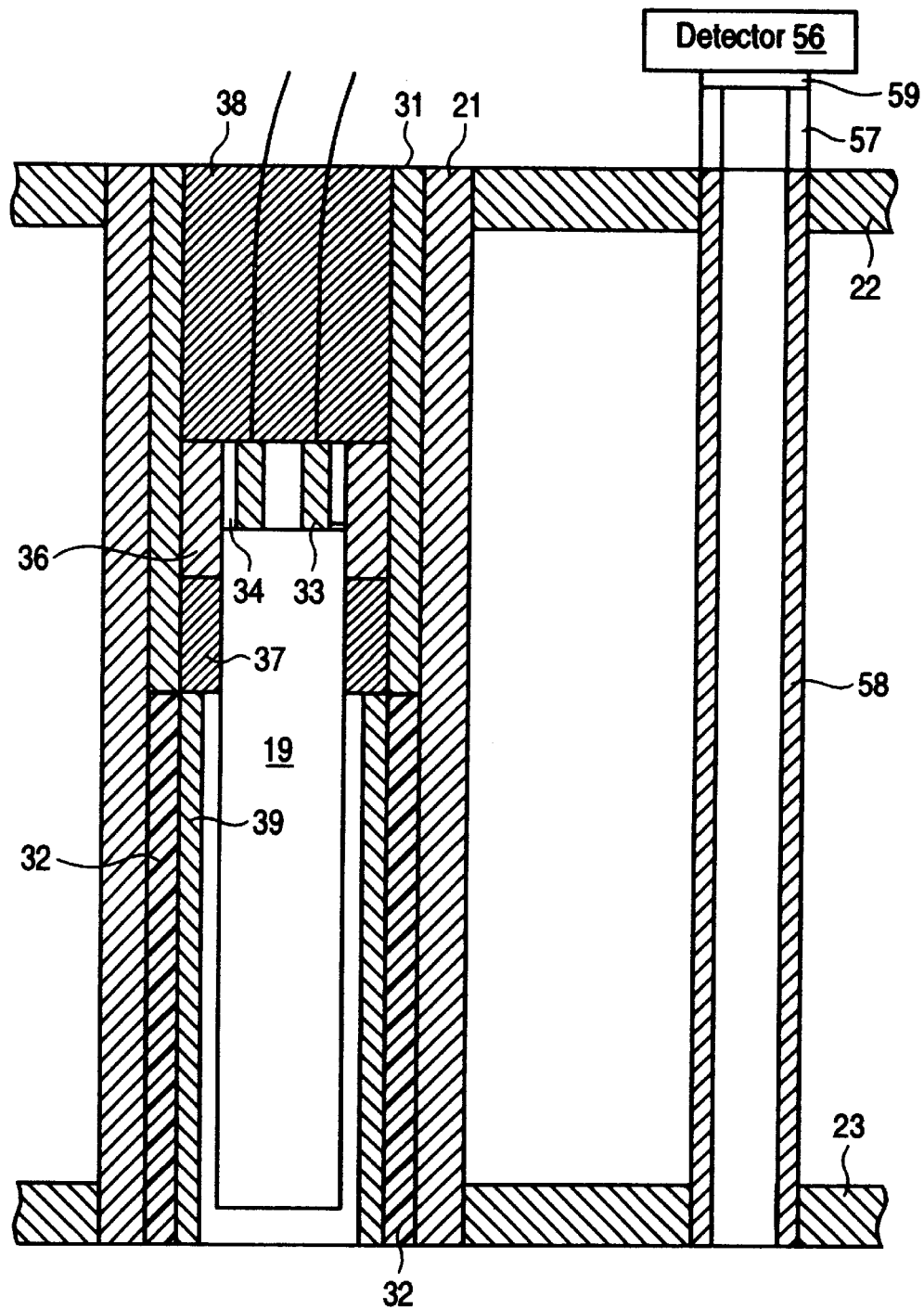
FIG. 5 is an enlarged view showing a light pipe and temperature sensing pipe in accordance with the present invention.

Lamps 19 include a filament wound as a coil with its axis parallel to that of the lamp envelope. Most of the light is emitted perpendicular to this axis towards the walls of the surrounding light pipe. In FIG. 5 the preferred assembly of the lamp 19 in the light pipe 21 is shown. An upper stainless steel sleeve 31 is placed in the light pipe and a lower stainless steel sleeve 32 is also placed in the light pipe. The interior surface of the sleeve 32 is gold plated to prevent the surface from oxidizing and to maintain a high level of reflectivity. It has been found that when the gold is plated directly onto the stainless steel sleeve 32, and the sleeve is heated by radiation from the lamp, the gold diffuses into the stainless steel and loses some of its reflectivity. This problem was solved by using a nickel diffusion barrier between the stainless steel and the gold. The nickel barrier was applied using standard electroless nickel plating techniques, and then the high purity gold was applied by gold plating.

About half of the radiant energy from the lamp goes out of the end of the associated light pipe after many reflections. The other half is absorbed at the base of the lamp. This can cause the base of the lamp to reach much higher temperatures as compared to a lamp radiating in open space.

If the base gets too hot the average lamp lifetime can be substantially reduced. This lamp degradation is caused by a rupture in the seal around the molybdenum plates 33 which carry the electrical energy to the filament. Above about 300° C. the molybdenum is easily oxidized and the resulting molybdenum oxide causes a volume expansion which ruptures the quartz or causes an open circuit. Thus, it was necessary to provide a means for cooling the lamp base. By placing a metal such as a solder alloy 36 between the sleeve 31 and lamp base 34, which can easily be melted in place, excellent heat transfer is provided through the metal to the surrounding stainless steel wall 31. This allows the base 34 of the lamp to operate at acceptable temperatures. The solder can be applied by first placing a ceramic potting compound 37 to form a dam and then applying the metal in the space between the base 34 and the cylinder 31. The assembly may then be potted with a ceramic potting compound 38.

A second lamp failure mechanism occurs when the temperature of the envelope increases above 550° C. At this temperature the quartz envelope begins to react with the gas species within the envelope. Furthermore, the envelope softens enough to balloon or blister since tungsten halogen bulbs operate with very high internal gas pressure. This problem is alleviated by inserting a precision ground quartz sleeve 39 between the bulb envelope and the gold plated reflective sleeve 32, thus providing a better heat conduction path than air.

Lamp lifetimes can also be extended by operating the lamps at less than the rated voltage since in general the life-time is exponentially dependent upon the applied voltage. Thus by lowering the voltage the lifetime can be greatly increased.

Figure 7:
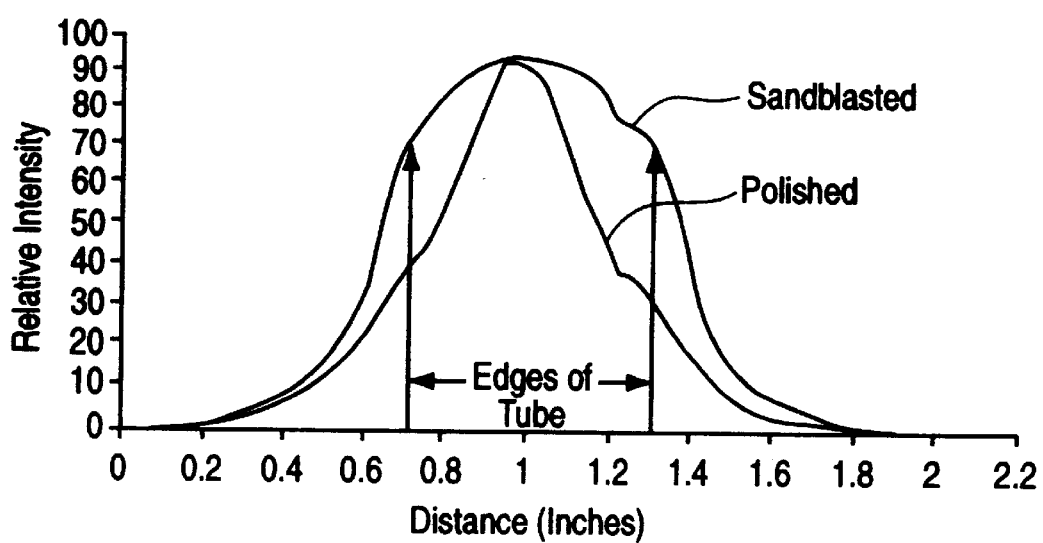
FIG. 7 shows the relative intensity of radiation from a light pipe as a function of distance across the light pipe for two surface finishes.

The light pipe length is selected to be at least as long as the associated lamp. It may be made longer provided that the power reaching the wafer is not substantially attenuated by increased reflections. FIG. 7 shows that for a cylindrical pipe, a polished surface results in a more focused intensity profile than a pipe with a sandblasted finish. The intensity scans of FIG. 7 were obtained by scanning a monitor across the end of a light pipe. Thus, the area and intensity pattern of the radiation can be controlled by control of the surface finish.

The pipe geometry, cross sectional shape, length, spatial layout and finish may be empirically optimized to provide uniform illumination or any desired spatial intensity profile. This may be achieved by measuring the spatial intensity profile of a single lamp light pipe and then using a computer program to sum the intensity profiles of multiple lamp light pipes by linear superposition. Thus, by controlling the critical parameters such as the gold sleeve finish, lamp spacing and shape of the light pipes to control the overlap of radiation from adjacent light pipes, one is able to achieve a uniform intensity profile which can then be modulated by controlling the lamp power to individual lamps to provide dynamic temperature uniformity or simply improved steady state uniformity.

The radiant energy source 18 comprising the plurality of light pipes and associated lamps allows the use of thin quartz windows to provide an optical port for heating a substrate within the evacuated process chamber. Conventional vacuum illuminating and heating systems require a quartz window which is relatively thick to withstand atmospheric pressure. The window can become very hot by absorbing infrared light from the hot substrate or from the heating source itself. A hot quartz window has several disadvantages for vacuum processing chambers. The window's sealing material may decompose. Substrate cooling rates are reduced thus reducing throughput or productivity of the processing machine. Reactive gasses may thermally decompose and deposit on the window causing decreased and non-uniform window transmission properties. The hot quartz window will emit black body radiation in the regions of the spectrum which are used to sense wafer temperature using optical pyrometers. Such interference increases the complexities of accurate wafer temperature measurements.

Figure 6:
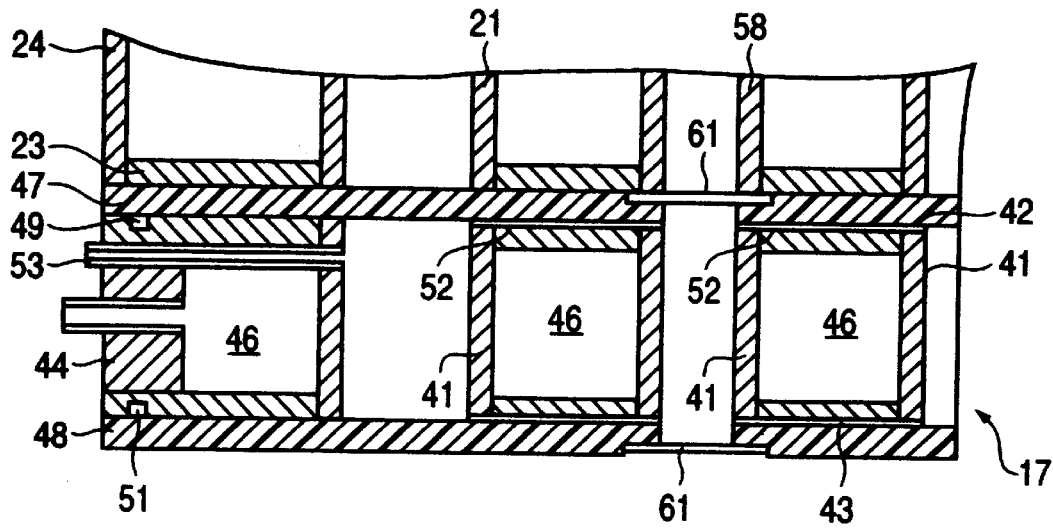
FIG. 6 is an enlarged view of a portion of the vacuum window shown in FIG. 3.

In accordance with the preferred embodiment of the present invention, a water cooled quartz window assembly 17 shown in greater detail in FIG. 6 is employed. The window assembly includes short light pipes 41 which are brazed to upper and lower flange plates 42 and 43 which have their outer edges sealed to wall 44. Cooling water is injected into the space 46 between light pipes and serves to cool the light pipes and flanges. The light pipes register with the light pipes 21 of the illuminator. The water cooled flange with the light pipe pattern which registers with the lamp housing is sandwiched between two quartz plates, 47 and 48. These plates are sealed to the flange with O rings 49 and 51 near the periphery of the flange. The upper and lower flange plates 42 and 43 include grooves 52 which provide communication between the light pipes. A vacuum is produced in the pipes by pumping through a tube 53 connected to one of the pipes which in turn is connected to the rest of the pipes by the very small recesses or grooves 52 in the face of the flange. Thus, when this sandwich structure is placed on a vacuum chamber the metal flanges, typically stainless steel which have excellent mechanical strength, provide adequate structural support. The lower quartz window, the one actually sealing the vacuum chamber, experiences little or no pressure differential because of the vacuum on each side, and thus can be made very thin.

The adapter plate concept allows quartz windows to be easily changed for cleaning or analysis. In addition, the vacuum between the quartz windows of the adapter plate provides an extra level of protection against toxic gasses escaping the reaction chamber. Any changes in the pressure of this vacuum is used to detect window rupture. Once detected, a safety interlock signal can cause the reactor to be purged and restored to a secure condition.

In order to adjust the radiation intensity of the lamps, it is required that the temperature of the substrate or wafer be measured. Temperature distribution of a wafer may be monitored using thermocouples. It is difficult, however, to attach many thermocouples to a wafer to attain temperature uniformity data with good spatial resolution. In addition, thermocouples themselves will alter the local heating and cooling of the wafer and can lead to erroneous temperature measurements. The technique of attaching thermocouples may not be used when actually processing wafers and thus is only useful in setting up and calibrating the equipment.

Figure 9:
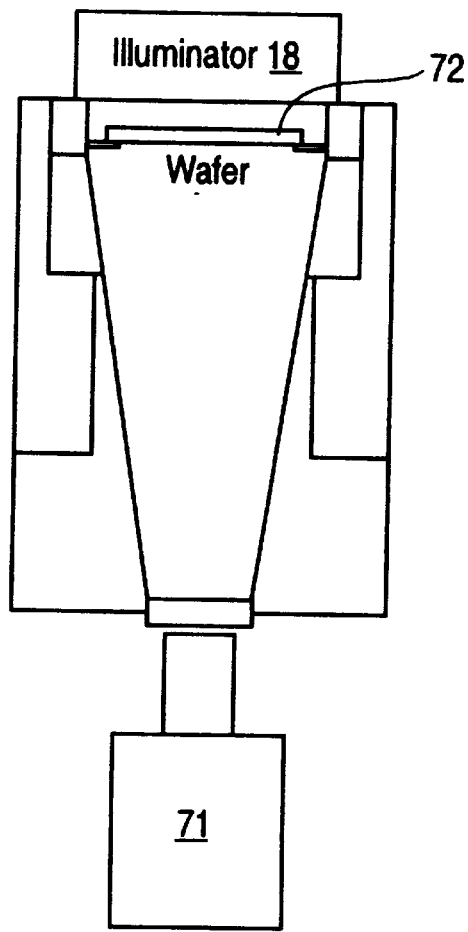
FIG. 9 is a schematic view of a rapid thermal heating apparatus including an infrared camera viewing the backside of a wafer being processed.

Another technique is to use an infrared camera such as a camera made by Agema which can be focused on the back or front side of the wafer and used to sense infrared radiation emitted by the wafer. Referring to FIG. 9, camera 71 is shown viewing the backside of the wafer 72, which is illuminated by illuminator 18. The camera senses radiation in the wavelength region of 8–12 micrometers emitted by the wafer. No light from the heating source is detected because all light with wavelengths above about four micrometers is absorbed by the quartz window. The infrared camera can detect differences of less than 3° C. for temperatures of up to 1,200° C. with a spatial resolution of better than 1/10 of an inch on a six inch diameter silicon wafer. In addition, color coded thermal maps of the wafer temperature can be stored at rates of many times per second and thus the wafer temperature uniformity can be monitored during rapid thermal ramps. With the use of a camera, it is possible to obtain temperature uniformity by simply manually adjusting the electrical power applied to each of the individual lamps. Alternately, the camera may be associated with an optical pickup that detects the radiation pattern and feeds a video input to a computer which can then control silicon controlled rectifiers or other power supplies for each of the bulbs to maintain the correct temperature uniformity across the wafer.

However, in a commercial machine it may be too expensive to use a separate infrared camera on each reactor because of the high cost and also because, in many cases, gas injectors and other process hardware obscure the view of the wafer. It is thus desirable to measure the wafer temperature from the illuminated side.

In accordance with another feature of the present invention the spaces between the light pipes is provided with small hollow pipes 58 to provide a path for light emitted by the wafer to reach an optical pyrometer detector.

Referring now to FIG. 5, a pyrometer or detector 56 is shown cooperating with an adapter 57 which is connected to the light pipe 58 extending between the upper and lower flanges 22 and 23. A filter 59 is inserted in front of the pyrometer and is selected to pass infrared energy of wavelength region 4.8–5.2 micrometers which is outside of the wavelength region passed by the quartz window. Thus light from the lamps does not interfere with the radiation from the wafer picked up by the detector.

In the window assembly the quartz windows 47 and 48 adjacent the light pipe 58 are shown as being cut out and fitted with sapphire windows 61 which transmit light of wavelength out to about 6.5 micrometers. Thus, light from the wafer is allowed to pass through the sapphire windows up through the light pipe 58 through the filter 59 and to the detector 56 which provides an output signal which is indicative of the surface temperature of the wafer within the field of view of the light pipe.

Figure 8:
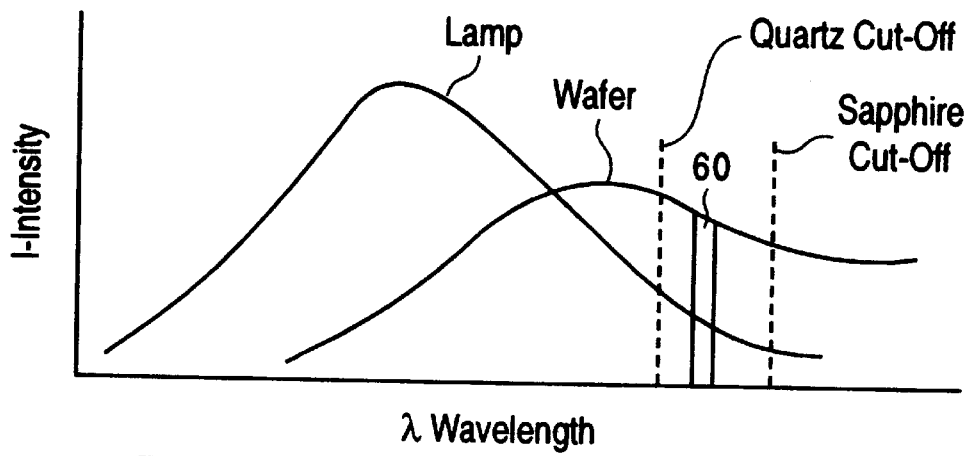
FIG. 8 is a curve illustrating radiation intensity as a function of wavelength for incident and emitted energy.

Referring to FIG. 8, the lamp and wafer radiation wavelengths is shown by the labeled curves. The filter 59 bandpass is shown by the window 60 between the quartz cut-off and sapphire cut-off wavelengths. It is seen that the energy is primarily wafer energy.

The dimensions of the light pipe may typically be 0.15 inches in diameter and five inches long. This geometry ensures that the area of the wafer sampled by the pyrometer is small simply because the acceptance angle for such a light pipe is small. Many pyrometers can be used to sample many areas of the wafers.

Using proportional, integration, and differentiation software the power to groups of lamps close to each pyrometer is controlled to control the energy applied to localized areas. Using this technique dynamic wafer temperature uniformity is automated. The temperature of a substrate is thus controlled as a function of time and position. A desired temperature versus time profile can be entered into a control computer and multiple pyrometer feedback loops will ensure that the wafer temperature is uniform and maintained throughout the thermal cycle. An added benefit of this technique is that temperature uniformity can be achieved despite changes in optical properties of the process chamber or previous thermal history, thus eliminating chamber memory effects which plague so many reactors commonly in use. Lamp grouping with pyrometers is simplified by rotating the wafers because lamps can then be assigned pyrometer control loops according to radii. This drastically reduces the number of pyrometers and control loops needed. The wafer rotation will also improve the uniformity of other process parameters such as gas injection and mass transport to the wafer surface.

Referring to FIG. 3, the wafer 72 is supported at its edge by spaced support fingers 62 mounted on a support tube 63. The support 63 is rotatably supported from the walls of the chambers 14 by a bearing assembly 64. Magnets 66 are mounted on the support. The magnetic fields of the magnets extend through the wall 14 and couple to magnets 67 mounted on a drive ring 68 which is suitably driven (not shown). Rotation of the ring causes the wafer support tube 63 and wafer to rotate. The magnetic coupling eliminates the need for an elaborate vacuum sealed drive assembly.

Schematically shown is a gas injection head 69 for injecting processing gases into the chamber 13A whereby various processing steps may be carried out in the chamber.

Figure 10:
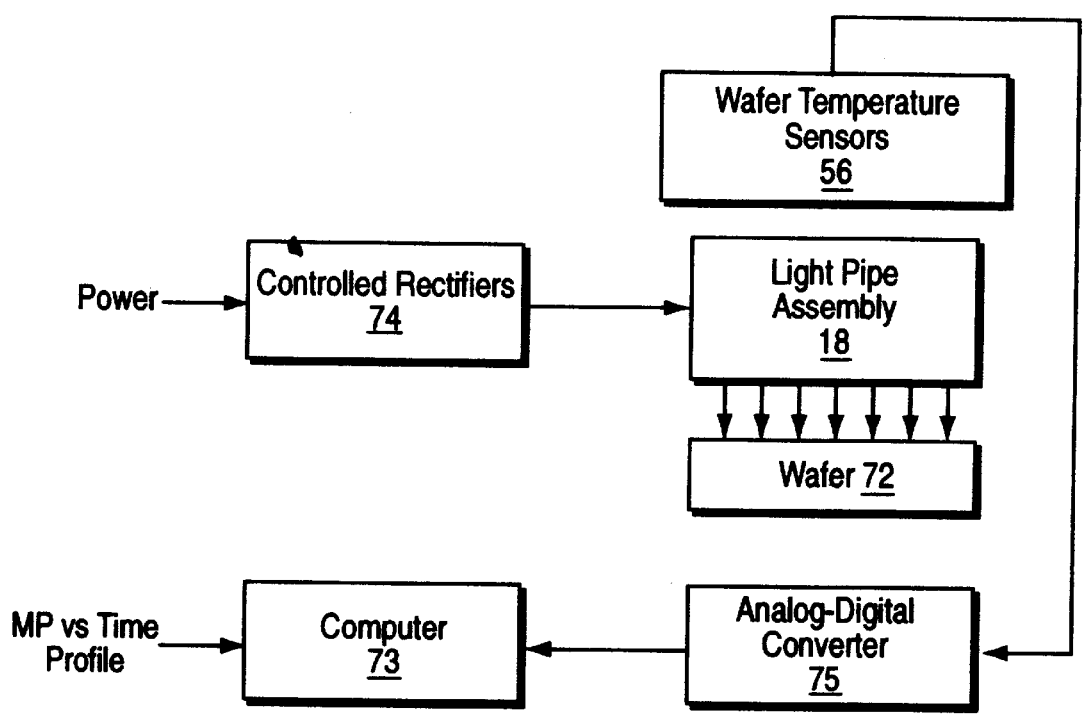
FIG. 10 is a schematic diagram of a typical control circuit which can be used to control the rapid thermal heating apparatus in accordance with the invention.

Referring to FIG. 10, there is schematically shown the control circuit for a rapid thermal processing apparatus in accordance with the invention. The temperature sensors 56 provide an analog output signal representative of the annotated water temperature. The analog output signals are converted by an A to D converter 75. The digital signals are applied to a computer 73. The desired temperature time profile is entered into the computer. The computer then provides output digital signals to the rectifiers 74 which control the power to the individual lamps or a group of lamps associated with each sensor.

When a bulb burns out and a new bulb is installed, the new bulb must be calibrated to maintain the bundle illumination profile. This is accomplished by measuring the light output versus voltage characteristic for each bulb using a calorimeter. Thus when a lamp is replaced, a lookup table of scaling factors in the computer is updated to account for any bulb differences. When a power command is given to any bulb, it is first modified using the scaling factors and then sent to control the silicon controlled rectifiers.

Thus there has been provided a rapid thermal heating operation in which the temperature profile of a wafer can be closely controlled to minimize stress-induced wafer damage during wafer processing.

What is claimed is:

1. An apparatus for the rapid thermal processing of a substrate in a processing chamber, comprising:

a circular support for a single substrate spaced from the walls of said chamber, said support having a support surface for the substrate;

a plurality of radiant energy sources positioned on a first side of the substrate;

reflectors associated with said radiant energy sources to direct radiant energy to the substrate to radiate predetermined regions of the first side of the substrate with a pattern of radiation intensity;

an injection head located on a second side of the substrate to pass a processing gas thereto;

a bearing assembly that supports the circular support so that the circular support can be rotated, said bearing assembly having a plurality of magnets mounted thereon and said bearing assembly positioned on the second side of the substrate;

a drive ring external to said chamber having a plurality of magnets mounted thereon providing a magnetic field coupled between said bearing assembly magnets and said drive ring magnets; and a drive for rotating said drive ring, thereby rotating the circular support inside said chamber.

2. An apparatus for the rapid thermal processing of a substrate in a processing chamber, comprising:

a support having a support surface to support only one substrate inside said processing chamber;

a plurality of radiant energy sources positioned on a first side of the substrate;

reflectors associated with said radiant energy sources to direct radiant energy to the substrate to radiate predetermined regions of the first side of the substrate with a pattern of radiation intensity;

an injection head located on a second side of the substrate to pass a processing gas thereto;

a bearing assembly that supports said support so that it can be rotated, said bearing assembly positioned on the second side of the substrate;

a rotatable drive ring external to said processing chamber to provide a force to couple said bearing assembly to said drive ring without the use of a vacuum seal so that rotation of said drive ring causes said support inside said processing chamber to rotate; and a drive for rotating said drive ring to thereby rotate said support inside said processing chamber.

* * * * *